(12) United States Patent
Yasuda

(10) Patent No.: US 7,940,147 B2
(45) Date of Patent: May 10, 2011

(54) BALANCED ACOUSTIC WAVE FILTER DEVICE AND COMPOSITE FILTER

(75) Inventor: Junpei Yasuda, Ishikawa-gun (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/749,661

(22) Filed: Mar. 30, 2010

(65) Prior Publication Data

US 2010/0176901 A1   Jul. 15, 2010

Related U.S. Application Data

(63) Continuation of application No. PCT/JP2008/067200, filed on Sep. 24, 2008.

(30) Foreign Application Priority Data

Oct. 17, 2007   (JP) ................................. 2007-270298

(51) Int. Cl.
*H03H 9/64* (2006.01)
(52) U.S. Cl. ...................... 333/195; 333/133; 310/313 D
(58) Field of Classification Search .................. 333/133, 333/193–196; 310/313 B, 313 D
See application file for complete search history.

(56) References Cited

U.S. PATENT DOCUMENTS

| 6,791,437 | B2 * | 9/2004 | Hagn et al. ..................... 333/195 |
| 7,019,435 | B2 * | 3/2006 | Nakaya et al. ............. 310/313 D |
| 2002/0057141 | A1 | 5/2002 | Nishizawa et al. |
| 2007/0018756 | A1 | 1/2007 | Fujii et al. |
| 2007/0103254 | A1 | 5/2007 | Haruta et al. |
| 2007/0120626 | A1 * | 5/2007 | Makibuchi et al. ........... 333/193 |
| 2010/0045399 | A1 * | 2/2010 | Yasuda .......................... 333/25 |

FOREIGN PATENT DOCUMENTS

| JP | 2001-267881 A | 9/2001 |
| JP | 2004-235908 A | 8/2004 |
| WO | 2006/003787 A1 | 1/2006 |
| WO | 2006/009021 A1 | 1/2006 |

OTHER PUBLICATIONS

Official Communication issued in International Patent Application No. PCT/JP2008/067200, mailed on Dec. 22, 2008.

* cited by examiner

*Primary Examiner* — Barbara Summons
(74) *Attorney, Agent, or Firm* — Keating & Bennett, LLP

(57) ABSTRACT

In an acoustic wave filter device, first and second acoustic wave filter elements are connected in parallel to an unbalance terminal. Of first to third IDTs, the second and third IDTs are connected to a first balance terminal. Of fourth to sixth IDTs, the fifth and sixth IDTs are connected to a second balance terminal. The first ground terminal is arranged at a position close to the side of the unbalance terminal and shifted to the side of the first acoustic wave filter element. The third ground terminal is arranged in a point-symmetric relationship relative to the first ground terminal with respect to a middle point between the first and second acoustic wave filter elements.

12 Claims, 9 Drawing Sheets

BALANCED ACOUSTIC WAVE FILTER DEVICE AND COMPOSITE FILTER

BACKGROUND OF THE INVENTION

1. Field of the Invention

The present invention relates to a balanced acoustic wave filter device having a balance-unbalance conversion function. More particularly, the present invention relates to an acoustic wave filter device having an improved arrangement of ground lines on a piezoelectric substrate and an improved arrangement of ground terminals, and also relates to a composite filter using the acoustic wave filter device.

2. Description of the Related Art

A cellular phone, for example, has recently been proposed with a plurality of communication systems installed therein. Accordingly, there is a significant demand to increase the amount of attenuation in bands other than the pass band so as to reduce mutual adverse influences among the communication systems. Further, with downsizing of the cell phone, a small dual filter chip has been developed which includes two filter elements on one piezoelectric substrate.

As one example of such a dual filter chip, WO2006/003787 discloses a balanced acoustic wave filter device illustrated in FIG. 18.

A balanced acoustic wave filter device 1000 disclosed in WO2006/003787 includes an electrode structure on a piezoelectric substrate 1002. First and second longitudinally-coupled acoustic surface wave filters 1001 and 1001A are provided on the piezoelectric substrate 1002.

The first acoustic surface wave filter 1001 is a balanced acoustic surface wave filter having an unbalance terminal 1003 and first and second balance terminals 1004 and 1005, so as to provide a balance-unbalance conversion function. The acoustic surface wave filter 1001 includes first and second 3-IDT longitudinally-coupled resonator-type acoustic surface wave filters 1007 and 1008 which are connected to the unbalance terminal 1003 through a 1-port acoustic surface wave resonator 1006. Also, the acoustic surface wave filters 1007 and 1008 are connected to first and second balance terminals 1004 and 1005 through 1-port acoustic surface wave resonators 1009 and 1010, respectively.

The second acoustic surface wave filter 1001A is configured similar to the first acoustic surface wave filter 1001. Accordingly, the above description of the first acoustic surface wave filter 1001 is similarly applied to a description of the second acoustic surface wave filter 1001A with "A" added to each of reference numbers which are used in the description of the first acoustic surface wave filter 1001.

In the acoustic wave filter device 1000, the first and second acoustic surface wave filters 1001 and 1001A each having the balance-unbalance conversion function are disposed on one piezoelectric substrate 2. Further, a ground-side end of the balance-side IDT, i.e., the IDT connected to the balance terminal 1004 or 1005, in the acoustic surface wave filter 1001 and a ground-side end of the balance-side IDT connected to the first balance terminal 1004A or the second balance terminal 1005A in the second acoustic surface wave filter 1001A are connected in common by lines 1011 and 1011A and are further connected to a ground potential. Thus, a common ground terminal 1021 illustrated in FIG. 18 is connected to the ground potential, whereby the balance-side IDT is connected to the ground potential. In other words, the size of the acoustic wave filter device 1000 is reduced by connecting the ground-side ends of the IDTs, which are connected to the terminal ends 1004, 1005, 1004A and 1005A, in common to one ground terminal 1021.

However, the above-described acoustic wave filter device 1000 has problems in that a signal balance level is not sufficient between the first and second balance terminals 1004 and 1005 and between the first and second balance terminals 1004A and 1005A on the higher frequency side than the pass band, and an attenuation characteristic outside the pass band is not sufficient.

SUMMARY OF THE INVENTION

To overcome the problems described above, preferred embodiments of the present invention provides an acoustic wave filter device which can increase a balance level of a signal taken out between first and second balance terminals in a frequency range outside the pass band on the side higher than the pass band, and which can improve the attenuation characteristic outside the pass band, and a composite filter including the acoustic wave filter device.

According to a first preferred embodiment of the present invention, a balanced acoustic wave filter device includes an unbalance terminal and first and second balance terminals, the balanced acoustic wave filter device including a piezoelectric substrate, a first longitudinally-coupled acoustic wave filter element disposed on the piezoelectric substrate, including second, first, and third IDTs which are connected between the unbalance terminal and the first balance terminal and which are successively arranged in a direction of propagation of acoustic surface waves, and including first and second reflectors arranged on both sides, in the direction of propagation of acoustic surface waves, of an area in which the first to third IDTs are disposed, a second longitudinally-coupled acoustic wave filter element disposed on the piezoelectric substrate in a spaced relationship, in the direction of propagation of acoustic surface waves, to a portion of the piezoelectric substrate in which the first acoustic wave filter element is disposed, including fifth, fourth, and sixth IDTs which are connected between the unbalance terminal and the second balance terminal and which are successively arranged in the direction of propagation of acoustic surface waves, and including third and fourth reflectors arranged on both sides, in the direction of propagation of acoustic surface waves, of an area in which the fourth to sixth IDTs are disposed, the second acoustic wave filter element providing an output signal having a phase with respect to an input signal, which differs by 180° from a phase of an output signal of the first acoustic wave filter element with respect to an input signal, wherein the balanced acoustic wave filter device further includes a first ground terminal which is disposed at a position closer to the side of the unbalance terminal than the first and second acoustic wave filter elements and shifted to the side of the first acoustic wave filter element from a middle point between the first and second acoustic wave filter elements, and which is electrically connected to a respective end of each of the second, third, fifth and sixth IDTs, or to a respective end of each of the first and fourth IDTs, a third ground terminal which is electrically connected to a respective end of each of the second, third, fifth and sixth IDTs, or to a respective end of each of the first and fourth IDTs, and which is arranged in a point-symmetric relationship relative to the first ground terminal with respect to the middle point between the first and second acoustic wave filter elements, a first signal wiring which is connected to a respective other end of each of the second and third IDTs, or to the other end of the first IDT, and which connects the first acoustic wave filter element and the first balance terminal to each other, a second signal wiring which is connected to a respective other end of each of the fifth and sixth IDTs, or to the other end of the fourth IDT, and which connects the second acoustic wave filter element and the second balance terminal to each other, and a second ground terminal disposed in an area disposed between the first and second signal wirings.

According to a second preferred embodiment of the present invention, a balanced acoustic wave filter device includes an unbalance terminal and first and second balance terminals, the balanced acoustic wave filter device including a piezoelectric substrate, a first longitudinally-coupled acoustic wave filter element disposed on the piezoelectric substrate, including second, first, and third IDTs which are connected between the unbalance terminal and the first balance terminal and which are successively arranged in a direction of propagation of acoustic surface waves, and including first and second reflectors arranged on both sides, in the direction of propagation of acoustic surface waves, of an area in which the first to third IDTs are disposed, a second longitudinally-coupled acoustic wave filter element disposed on the piezoelectric substrate in a spaced relationship, in the direction of propagation of acoustic surface waves, to a portion of the piezoelectric substrate in which the first acoustic wave filter element is disposed, including fifth, fourth, and sixth IDTs which are connected between the unbalance terminal and the second balance terminal and which are successively arranged in the direction of propagation of acoustic surface waves, and including third and fourth reflectors arranged on both sides, in the direction of propagation of acoustic surface waves, of an area in which the fourth to sixth IDTs are disposed, the second acoustic wave filter element providing an output signal having a phase with respect to an input signal, which differs by 180° from a phase of an output signal of the first acoustic wave filter element with respect to an input signal, wherein the balanced acoustic wave filter device further includes a first ground terminal which is disposed at a position closer to the side of the unbalance terminal than the first and second acoustic wave filter elements and shifted to the side of the first acoustic wave filter element from a middle point between the first and second acoustic wave filter elements, and to which are connected the second, third, fifth and sixth IDTs, a third ground terminal to which are connected the second, third, fifth, and sixth IDTs, and which is arranged in a point-symmetric relationship relative to the first ground terminal with respect to the middle point between the first and second acoustic wave filter elements, a first signal wiring connecting the first IDT of the first acoustic wave filter element and the first balance terminal to each other, a second signal wiring connecting the fourth IDT of the second acoustic wave filter element and the second balance terminal to each other, and a second ground terminal disposed in an area disposed between the first and second signal wirings, the second IDT having a ground end connected to the first ground terminal, the ground end of the second IDT not being directly connected to the first ground terminal and being connected to the first ground terminal through an end of the third IDT, which is connected to a ground potential. In this case, since the ground end of the second IDT is connected to the first ground terminal through the end of the third IDT, which is connected to the ground potential, a line from the ground end of the second IDT to the first ground terminal is longer than a line between the ground end of the IDT, which is positioned closer to the first ground terminal, and the first ground terminal. Thus, the balance level and the attenuation characteristic can be further improved on the higher frequency side than the pass band.

According to a third preferred embodiment of the present invention, a balanced acoustic wave filter device of longitudinally-coupled resonator type includes an unbalance terminal and first and second balance terminals, the balanced acoustic wave filter device including a piezoelectric substrate, and a first IDT disposed on the piezoelectric substrate, second and third IDTs arranged on both sides of the first IDT in a direction of propagation of acoustic surface waves, fourth and fifth IDTs arranged on both sides, in the direction of propagation of acoustic surface waves, of a portion in which the first to third IDTs are disposed, and first and second reflectors arranged on both sides, in the direction of propagation of acoustic surface waves, of a portion in which the first to fifth IDTs are disposed, wherein the balanced acoustic wave filter device further includes an unbalance terminal and first and second balance terminals, a first ground terminal disposed on the piezoelectric substrate at a position that is closer to the side of the unbalance terminal than the first to fifth IDTs and is shifted toward the side of the fourth IDT from a center of the first IDT, first and second signal wirings connecting a respective end of each of the second and third IDTs to the first and second balance terminals, respectively, a second ground terminal disposed in an area disposed between the first and second signal wirings, and a third ground terminal arranged in a point-symmetric relationship relative to the first ground terminal with respect to a center of the portion in which the first to fifth IDTs are disposed, wherein a respective end of each of the first, fourth, and fifth IDTs is connected to the unbalance terminal, and a respective other end thereof is connected to the second ground terminal, the third IDT having a polarity reversed to a polarity of the second IDT, wherein a respective end of each of the second and third IDTs is connected to the first and second signal wirings, respectively, and respective other ends thereof are connected to the first ground terminal, and wherein an end of the second IDT on the side connected to the ground terminal and an end of the third IDT on the side connected to the ground terminal are connected to the first ground terminal at a position shifted to the side of the fourth IDT from a center of the balanced acoustic wave filter device and are connected to the third ground terminal at a position shifted to the side of the fifth IDT from the center of the balanced acoustic wave filter device.

According to a fourth preferred embodiment of the present invention, a balanced acoustic wave filter device of longitudinally-coupled resonator type includes a piezoelectric substrate, a first IDT disposed on the piezoelectric substrate, and second and third IDTs arranged on both sides of the first IDT in a direction of propagation of acoustic surface waves, fourth and fifth IDTs arranged on both sides, in the direction of propagation of acoustic surface waves, of a portion in which the first to third IDTs are disposed, and first and second reflectors arranged on both sides, in the direction of propagation of acoustic surface waves, of a portion in which the first to fifth IDTs are disposed, wherein the balanced acoustic wave filter device includes an unbalance terminal and first and second balance terminals, wherein a respective end of each of the second and third IDTs is connected to the unbalance terminal, wherein the first IDT includes a first split IDT portion and a second split IDT portion which are defined by the first IDT being split in the direction of propagation of acoustic surface waves, and a middle point portion at which a respective other end of each of the first and second split IDT portions 221a and 221b is connected to each other, wherein the first split IDT portion and the fourth IDT are connected to the first balance terminal, and the second split IDT portion and the fifth IDT are connected to the second balance terminal, wherein the third IDT has a polarity reversed to a polarity of the second IDT, and wherein the balanced acoustic wave filter device further includes a first ground terminal disposed on the piezoelectric substrate at a position that is closer to the side of the unbalance terminal than the first to fifth IDTs and is shifted toward the side of the fourth IDT from a center of the first IDT, a first signal wiring connecting one end of the fourth IDT and one end of the first split IDT portion to the first balance terminal, a second signal wiring connecting one end of the fifth IDT and one end of the second split IDT portion to the second balance terminal, a second ground terminal which is disposed in an area disposed between the first signal wiring and the second signal wiring, and which is connected to a respective other end of each of the second and third IDTs, and a third ground terminal arranged in a point-symmetric relationship relative to the first ground terminal with respect to a center of the portion in which the first to fifth IDTs are disposed, the other end of the fourth IDT, the middle point portion of the first IDT, and the other end of the fifth IDT all being connected to the first balance terminal at a position close to the side of the fourth IDT and all being connected to the third balance terminal at a position close to the side of the fifth IDT.

A composite filter according to another preferred embodiment of the present invention includes the balanced acoustic wave filter device according to one of the preferred embodiments of the present invention described above.

Preferably, the composite filter includes the balanced acoustic wave filter device and another acoustic wave filter device differing from the balanced acoustic wave filter device, the balanced acoustic wave filter device and the other acoustic wave filter device being disposed on one piezoelectric substrate, the balanced acoustic wave filter device and the other acoustic wave filter device sharing the first ground terminal. Thus, the composite filter can improve a signal balance level outside the pass band and can ensure a more satisfactory attenuation characteristic outside the pass band.

According to the first to fourth preferred embodiments of the present invention, since the first ground terminal is arranged at a position close to the side of the unbalance terminal and shifted to one side in the direction of propagation of acoustic surface waves, and the third ground terminal is arranged in a point-symmetric relationship relative to the first ground terminal with respect to the center of the portion in which the plurality of IDTs are disposed, influences of grounding are closer to each other among the IDTs connected to the balance terminals. Therefore, the difference in attenuation characteristic between the first and second balance terminals on the higher frequency side than the pass band can be reduced, and thus, the attenuation characteristic can be improved. Further, a signal balance level between the first and second balance terminals can be improved.

Other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
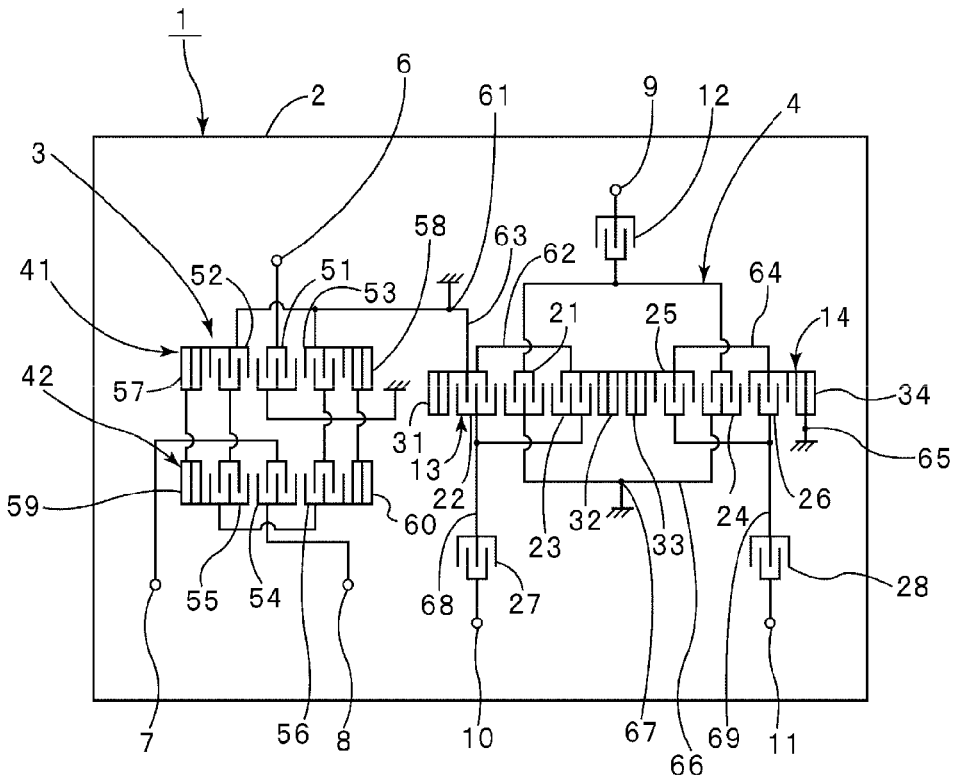
FIG. 1 is a schematic plan view of a composite filter according to a first preferred embodiment of the present invention.

FIG. 1 is a schematic plan view of a composite filter including an acoustic wave filter device according to a preferred embodiment of the present invention. The composite filter according to this preferred embodiment is an acoustic surface wave device in which a GSM900 reception filter and a GSM1800 reception filter are provided on one piezoelectric substrate 2.

The GSM900 reception filter 3 preferably has a pass band of 925 MHz to 960 MHz, and the GSM1800 reception filter 4 preferably has a pass band of 1805 MHz to 1880 MHz.

The GSM900 reception filter 3 and the GSM1800 reception filter 4, each having a balance-unbalance conversion function, include electrode structures on the piezoelectric substrate 2. The GSM900 reception filter 3 includes an unbalance terminal 6 and first and second balance terminals 7, 8. Similarly, the GSM1800 reception filter 4 includes an unbalance terminal 9 and first and second balance terminals 10, 11. An impedance on the side including the unbalance terminals 6 and 9 is preferably set to about 50Ω, or example, and an impedance on the side including the first and second balance terminals 7, 8, 10 and 11 is preferably set to about 100Ω, for example.

The reception filters 3 and 4 are each defined by an acoustic surface wave filter device having the illustrated electrode structure. Thus, the reception filters 3 and 4 are each defined by an acoustic surface wave filter device which has a balance-unbalance conversion function and an impedance conversion function.

In the composite filter 1 according to this preferred embodiment, the GSM1800 reception filter 4 of the two reception filters 3 and 4 is a balanced acoustic wave filter device according to one preferred embodiment of the present invention.

The GSM1800 reception filter 4 includes a 1-port acoustic surface wave resonator 12 connected to the unbalance terminal 9. First and second acoustic wave filter elements 13, 14 of the 3-IDT type are connected to the unbalance terminal 9 through the 1-port acoustic surface wave resonator 12. Each of the first and second acoustic wave filter elements 13, 14 is a 3-IDT longitudinally-coupled acoustic surface wave filter.

The first acoustic wave filter element 13 includes a first IDT 21 and second and third IDTs 22, 23 which are arranged on both sides of the first IDT 21 in the direction of propagation of acoustic surface waves. In other words, the IDTs to 23 are arranged in the order of the second IDT 22, the first IDT 21, and the third IDT 23 in the direction of propagation of acoustic surface waves. First and second reflectors 31, 32 are arranged on both sides, in the direction of propagation of acoustic surface waves, of an area in which the IDTs 21 to 23 are disposed.

In the second acoustic wave filter element 14, a fifth IDT 25, a fourth IDT 24, and a sixth IDT 26 are arranged in that order in the direction of propagation of acoustic surface waves. Third and fourth reflectors 33, 34 are arranged on both sides, in the direction of propagation of acoustic surface waves, of an area in which the fourth to sixth IDTs 24 to 26 are disposed. The second acoustic wave filter element 14 is arranged in a spaced relationship relative to the first acoustic wave filter element 13 in the direction of propagation of acoustic surface waves.

One end of the first IDT 21 of the first acoustic wave filter element 13 is connected to the unbalance terminal 9 through the 1-port acoustic surface wave resonator 12, and the other end thereof is connected to the ground potential. A respective end of each of the second and third IDTs 22, 23 is connected to the ground potential, and respective other ends thereof are connected in common and further connected to the first balance terminal 10 through an acoustic surface wave resonator 27. Also, in the second acoustic wave filter element 14, one end of the fourth IDT 24 at a center is connected to the unbalance terminal 9 through the 1-port acoustic surface wave resonator 12. A respective end of each of the fifth and sixth IDTs 25, 26 is connected to the ground potential, and respective other ends thereof are connected in common and further connected to the second balance terminal 11 through a 1-port acoustic surface wave resonator 28.

Meanwhile, the GSM900 reception filter 3 is configured such that first and second 3 IDT longitudinally-coupled resonator-type acoustic surface wave filters 41, 42 are cascaded in two stages. In the acoustic wave filter element 41, second, first, and third IDTs 52, 51, 53 are arranged in that order in the direction of propagation of acoustic surface waves. In the second acoustic wave filter element 42, fifth, fourth, and sixth IDTs 55, 54, 56 are arranged in that order in the direction of propagation of acoustic surface waves. Reflectors 57 and 58 are arranged on both sides, in the direction of propagation of acoustic surface waves, of an area in which the IDTs 51 to 53 are disposed, and reflectors 59 and 60 are arranged on both sides, in the direction of propagation of acoustic surface waves, of an area in which the IDTs 54 to 56 are disposed. Herein, one end of the first IDT 51 is connected to the unbalance terminal 6, and the other end thereof is connected to the ground potential. A respective end of each of the IDTs 52 and 53 is connected in common and further connected to a first ground terminal 61 that is described later. A respective other end of each of the IDTs 52 and 53 is connected to a respective end of each of the IDTs 55 and 56, and a respective other end of each of the IDTs 55 and 56 is connected in common. One end of the IDT 54 is connected to the first balance terminal 7, and the other end thereof is connected to the second balance terminal 8. The other end of the IDT 51 is connected to the ground potential. In addition, the reflector 58 is connected to a ground end of the IDT 53, and the reflector 58 is further connected to the reflector 60, a ground end of the IDT 56, a ground end of the IDT 55, the reflector 59, and to the reflector 57.

When the above-described electrode structure is provided on the piezoelectric substrate 2, a plurality of portions connected to the ground potential are usually connected in common for the purpose of size reduction. In the GSM1800 reception filter 4, i.e., in the acoustic wave filter device according to this preferred embodiment, ground ends of the IDTs 22 and 23 are connected in common by a line 62, and the ground end of the second IDT 22 is connected to the first ground terminal 61 by a line 63. Further, the ground end of the IDT 23 is electrically connected to the reflectors 32 and 33 and to a ground end of the IDT 25. The ground end of the IDT 25 is connected in common to a ground end of the sixth IDT 26 by a line 64. Accordingly, the ground ends of the IDTs 22, 23, 25 and 26, which are balance-side IDTs connected to the balance terminal 10 or the balance terminal 11, are connected to the first ground terminal 61.

On the other hand, a ground end of the IDT 26 is electrically connected to the reflector 34, and the reflector 34 is connected to a third ground terminal 65.

A respective ground end of each of the first and fourth IDTs 21, 24 connected to the unbalance terminal 9 is connected in common by a line 66 and further connected to a second ground terminal 67.

The first to third ground terminals 61, 65 and 67 are each connected to a bump, which is preferably connected to the ground potential, when mounted to a printed circuit board, for example.

Herein, the first ground terminal 61 is arranged at a position that is shifted to the side of the first acoustic wave filter element 13 from a middle point between the first and second acoustic wave filter elements 13, 14 and closer to the side of the unbalance terminal 9 than the first and second acoustic wave filter elements 13, 14. Such an arrangement is used because the composite filter 1 includes the GSM900 reception filter 3 and the GSM1800 reception filter 4 provided on the piezoelectric substrate 2, and the first ground terminal 61 is to be shared by both the reception filters 3 and 4. Stated another way, because the first ground terminal 61 is shared by both of the reception filters 3 and 4, the first ground terminal is disposed between both of the reception filters 3 and 4, and the unbalance terminals 6 and 9 are arranged on both sides of the first ground terminal 61.

Further, the second ground terminal 67 is shared by the first and fourth IDTs 21, 25 by connecting the ground ends of the first IDT 21 and the fourth IDT 24, which are connected to the unbalance terminal 9, in common by the line 66.

The second ground terminal 67 is disposed in an area disposed between first and second signal wirings 68, 69. The first signal wiring 68 is a signal wiring that connects the second and third IDTs 22, 23 of the first acoustic wave filter element 13 to the first balance terminal 10. Similarly, the second signal wiring 69 is a signal wiring that connects the fifth and sixth IDTs 25, 26 of the second acoustic wave filter element 14 to the second balance terminal 11.

In this preferred embodiment, the third ground terminal 65 is disposed at a position that is point-symmetric to the first ground terminal 61 with respect to the middle point between the first and second acoustic wave filter elements 13 and 14. The third ground terminal 65 is connected, as described above, to the IDT 26, which is the balance-side IDT, through the reflector 34. Further, the ground end of the IDT 26 is connected to the ground end of the IDT 25, which is also the balance-side IDT, by a line 64.

In the GSM1800 reception filter 4, therefore, the distance between the ground ends of the second and third IDTs 22, 23, which are the balance-side IDTs on the side of the first acoustic wave filter element 13, and the first ground terminal is similar to the distance between the ground ends of the fifth and sixth IDTs 25, 26, which are the balance-side IDTs on the side of the second acoustic wave filter element 14, and the third ground terminal 65. Accordingly, since the influence of impedance in the ground wiring for the IDTs 22 and 23, which are the balance-side IDTs, is similar to the influence of impedance in the ground wiring for the IDTs 25 and 26, which are also the balance-side IDTs, a balance level in a frequency range outside the pass band on the side higher than the pass band can be improved between the first and second balance terminals 10, 11, and an attenuation characteristic on the higher frequency side outside the pass band can be improved. In other words, the difference in attenuation characteristic between the first and second balance terminals on the higher frequency side than the pass band can be reduced. That point will be described below with reference to practical experimental examples.

Figure 2:
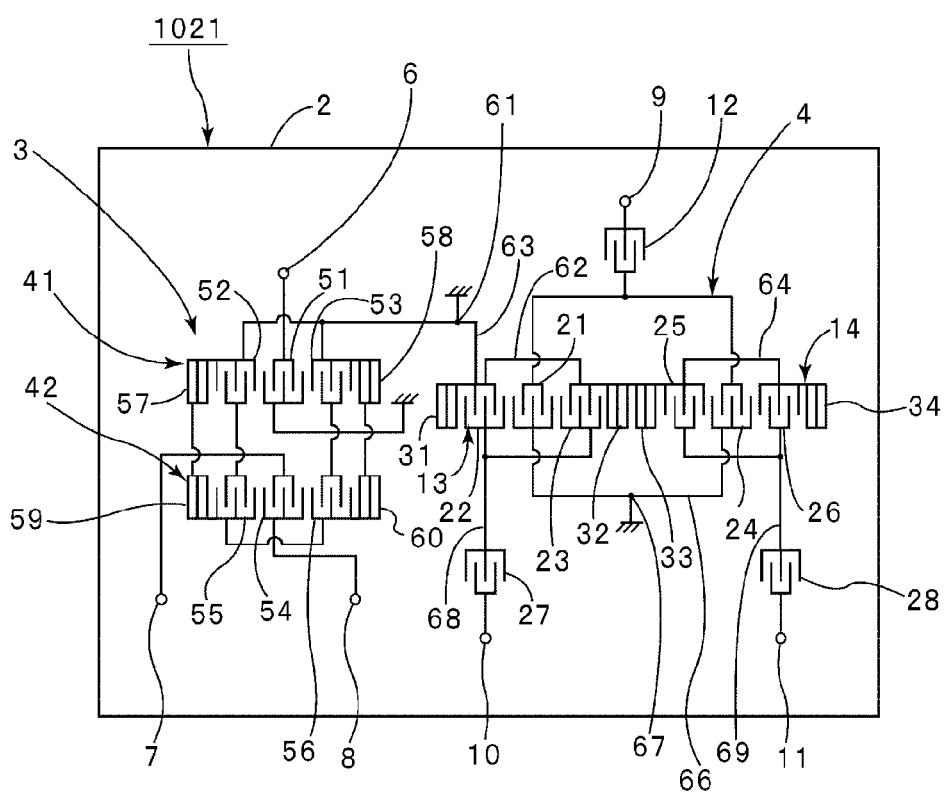
FIG. 2 is a schematic plan view of a composite filter according to a first comparative example that is prepared for comparison with the composite filter according to the first preferred embodiment of the present invention.

For comparison, a composite filter 1021, illustrated in FIG. 2, according to a first comparative example is prepared. The composite filter 1021 is similarly configured to the above-described composite filter 1 according to the first preferred embodiment of the present invention, except that the third ground terminal 65 is not provided in the composite filter 1021. Thus, the same components are denoted by the same reference numerals and description of those components is omitted.

Figure 3:
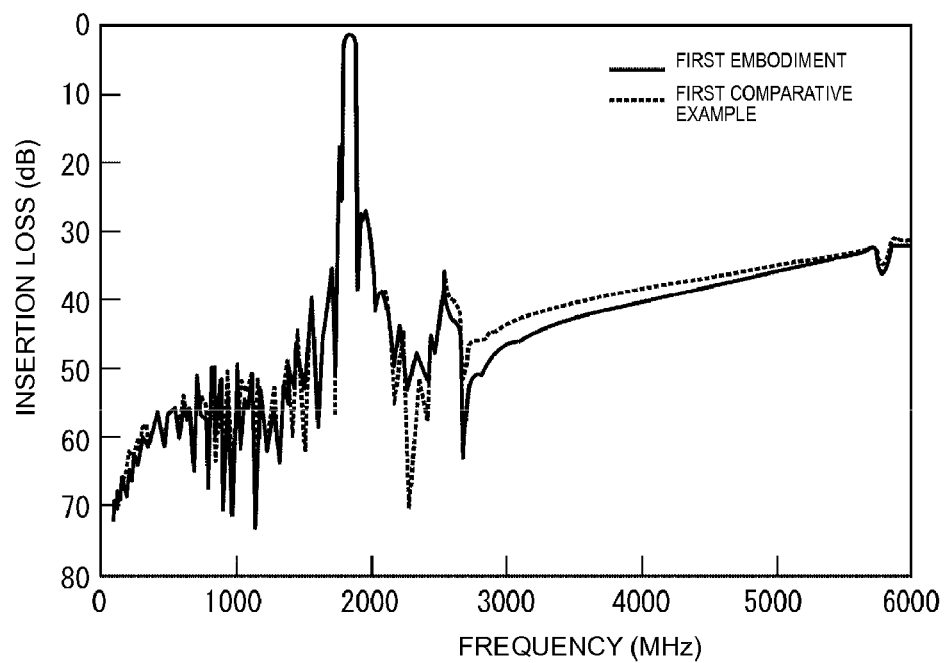
FIG. 3 is a graph illustrating differential characteristics of attenuation amounts in acoustic wave filter devices in the composite filters according to the first preferred embodiment and the first comparative example.

FIG. 3 is a graph illustrating differential characteristics of attenuation amounts in the respective GSM1800 reception filters 4 in the composite filters according to the first preferred embodiment and the first comparative example between the first and second balance terminals 10, 11. In the graph of FIG. 3, a solid line represents the result measured in the first preferred embodiment, and a dotted line represents the result measured in the first comparative example. The pass band of the GSM1800 reception filter 4 is preferably 1805 MHz to 1880 MHz. As seen from FIG. 3, the differential characteristic of the attenuation amount between the first and second balance terminals is improved in the first preferred embodiment as compared to the first comparative example on the higher frequency side than the pass band.

Figure 4:
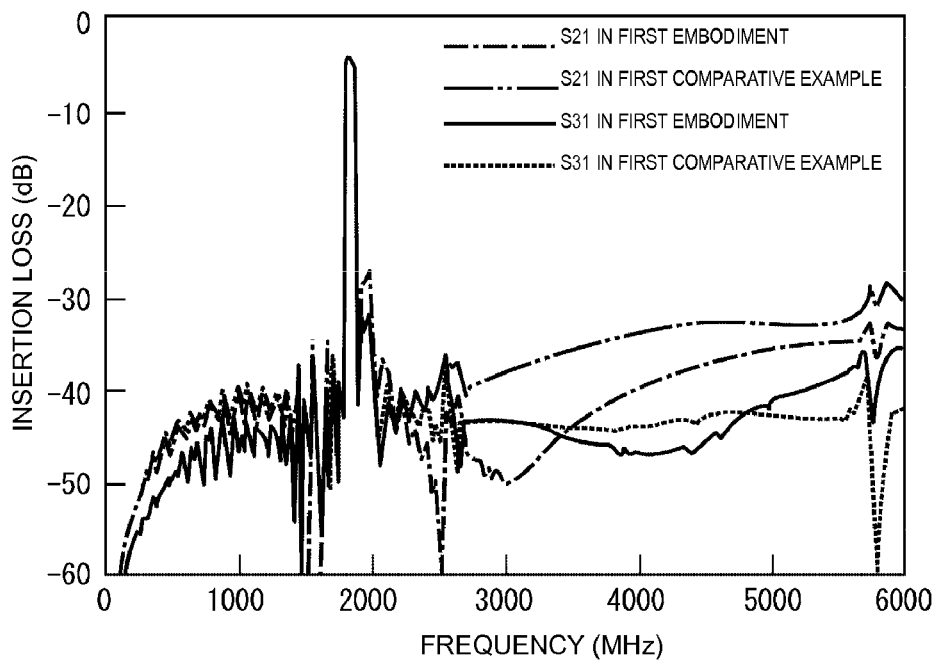
FIG. 4 is a graph illustrating attenuation characteristics S21 on the first balance terminal side and attenuation characteristics S31 on the second balance terminal side in the acoustic wave filter devices according to the first preferred embodiment and the first comparative example.

FIG. 4 is a graph illustrating attenuation characteristics S21 on the side of the first balance terminal 10 and attenuation characteristics S31 on the side of the second balance terminal 11 in the reception filters 4 according to the first preferred embodiment and the first comparative example. In the graph of FIG. 4, a solid line and a dotted line represent respective attenuation versus frequency characteristics S31 on the side of the second balance terminal 11 in the reception filters 4 according to the first preferred embodiment and the first comparative example. A one-dot-chain line and a two-dot-chain line represent respective attenuation versus frequency characteristics S21 on the side of the first balance terminal 10 in the reception filters 4 according to the first preferred embodiment and the first comparative example.

As shown in FIG. 4, in the first preferred embodiment, the attenuation amounts are increased on the higher frequency side than the pass band of 1805 MHz to 1880 MHz, i.e., in a frequency range of not lower than about 3000 MHz, as compared to the first comparative example.

Figure 5:
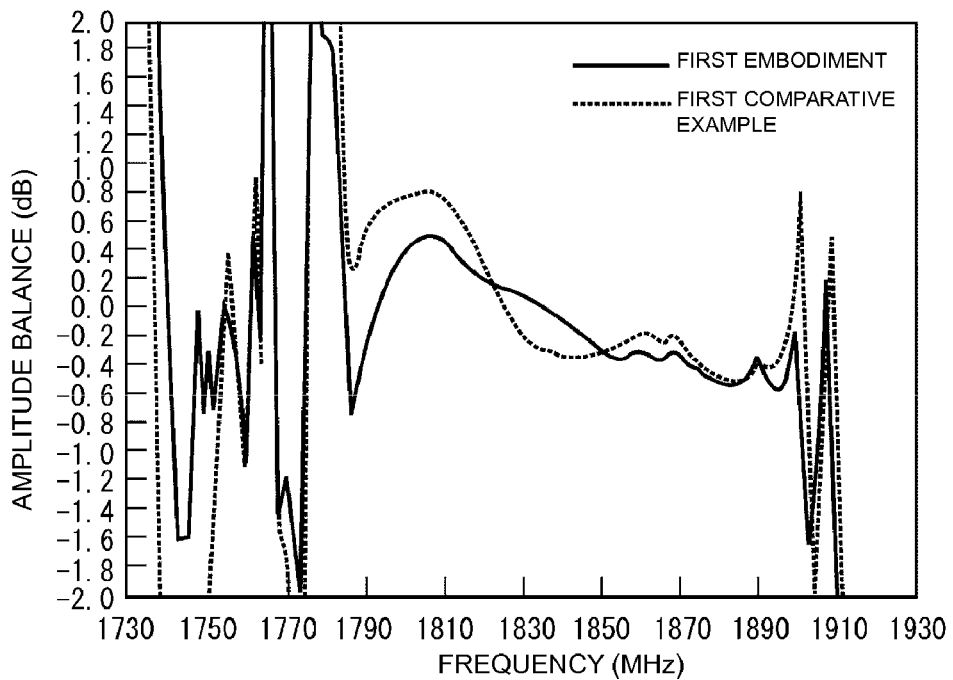
FIG. 5 is a graph illustrating amplitude balance characteristics of the acoustic wave filter devices according to the first preferred embodiment and the first comparative example.
Figure 6:
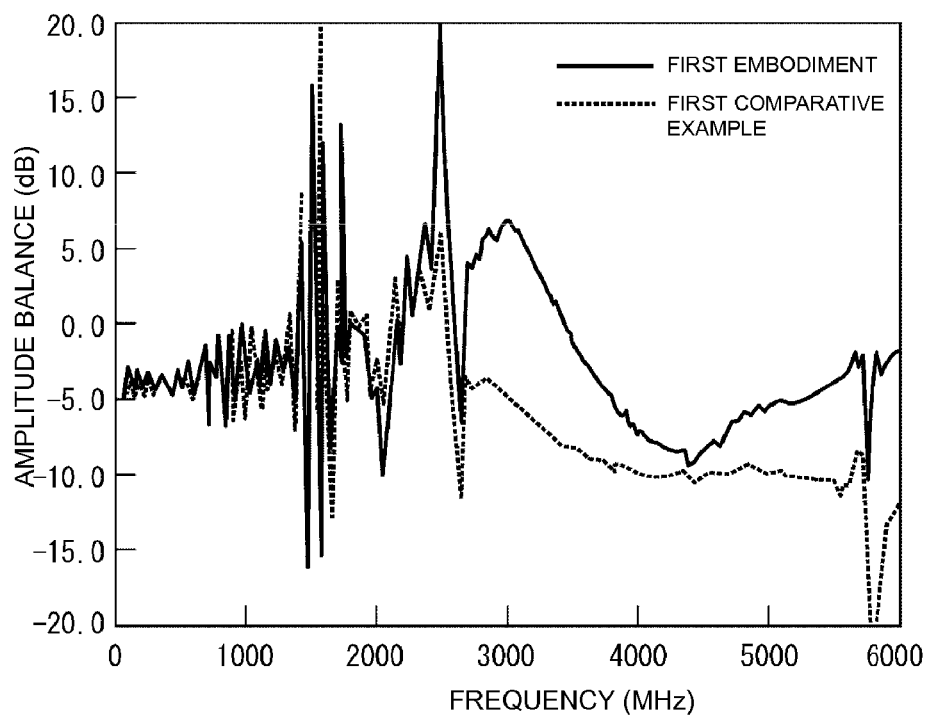
FIG. 6 is a graph illustrating the amplitude balance characteristics, illustrated in FIG. 5, over a wider frequency range.

FIGS. 5 and 6 are graphs illustrating amplitude balance characteristics of the reception filters 4 according to the first preferred embodiment and the first comparative example. FIG. 6 illustrates the amplitude balance characteristics, illustrated in FIG. 5, over a wider frequency range. In the graphs of FIGS. 5 and 6, a solid line represents the result measured in the first preferred embodiment, and a dotted line represents the result measured in the first comparative example.

Figure 7:
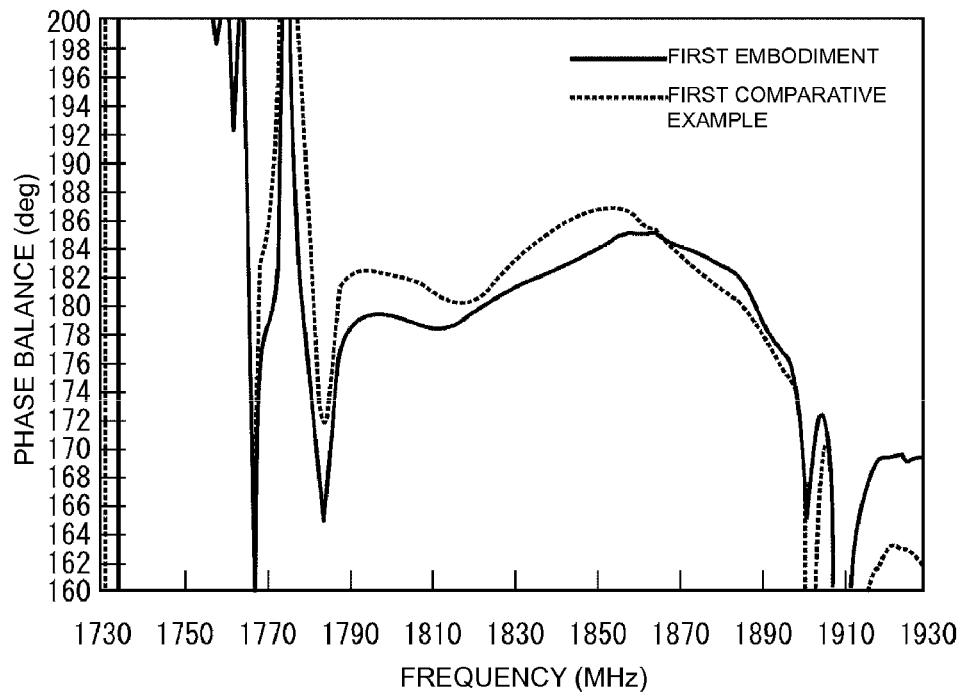
FIG. 7 is a graph illustrating phase balance characteristics of the acoustic wave filter devices according to the first preferred embodiment and the first comparative example.
Figure 8:
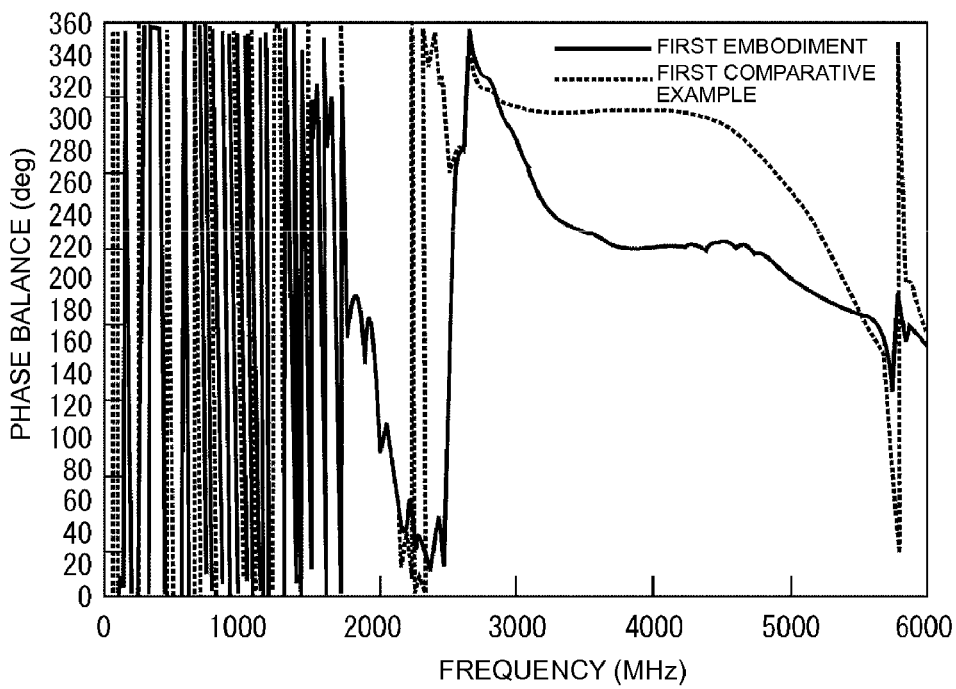
FIG. 8 is a graph illustrating the phase balance characteristics, illustrated in FIG. 7, over a wider frequency range.

FIGS. 7 and 8 are graphs illustrating phase balance characteristics of the reception filters 4 according to the first preferred embodiment and the first comparative example. FIG. 8 illustrates the phase balance characteristics, illustrated in FIG. 7, over a wider frequency range. In the graphs of FIGS. 7 and 8, a solid line represents the result measured in the first preferred embodiment, and a dotted line represents the result measured in the first comparative example.

Figure 9:
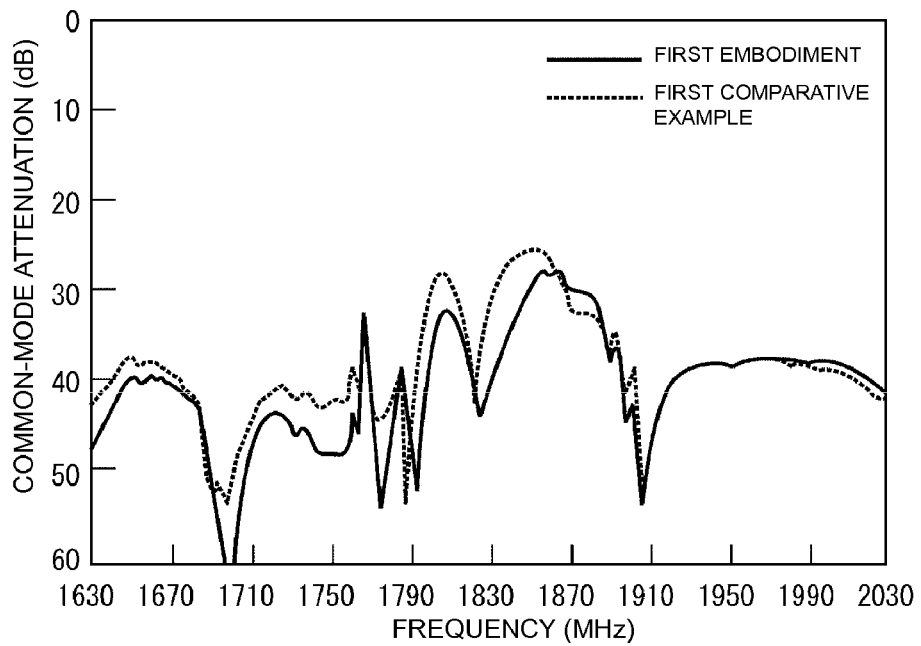
FIG. 9 is a graph illustrating common-mode attenuation characteristics of the acoustic wave filter devices according to the first preferred embodiment and the first comparative example.
Figure 10:
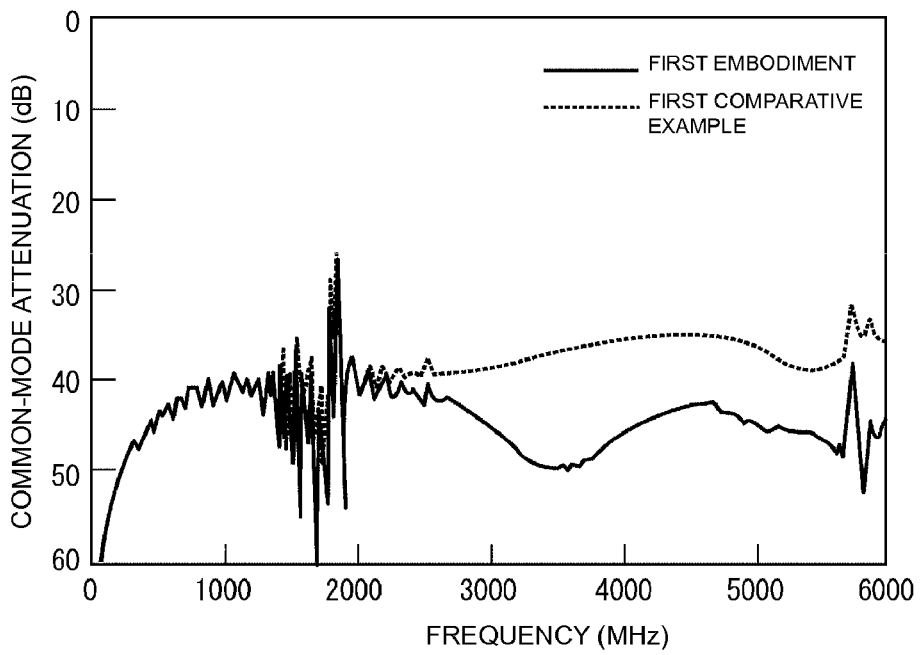
FIG. 10 is a graph illustrating the common-mode attenuation characteristics, illustrated in FIG. 9, over a wider frequency range.

FIGS. 9 and 10 are graphs illustrating common-mode attenuation characteristics of the reception filters 4 according to the first preferred embodiment and the first comparative example. FIG. 10 illustrates the common-mode attenuation characteristics, illustrated in FIG. 9, over a wider frequency range. In the graphs of FIGS. 9 and 10, a solid line represents the result measured in the first preferred embodiment, and a dotted line represents the result measured in the first comparative example.

As shown in FIGS. 5 to 10, in the first preferred embodiment, the amplitude balance characteristic, the phase balance characteristic, and the common-mode attenuation amount are all improved on the higher frequency side than the pass band of 1805 to 1880 MHz, i.e., in a frequency range of not lower than about 3000 MHz, as compared to the first comparative example.

More specifically, in the first preferred embodiment, the amplitude balance characteristic is closer to 0 dB and the phase balance characteristic is closer to 180° over a wide frequency range than in the first comparative example. Thus, it is understood that the balance level is improved.

Figure 11:
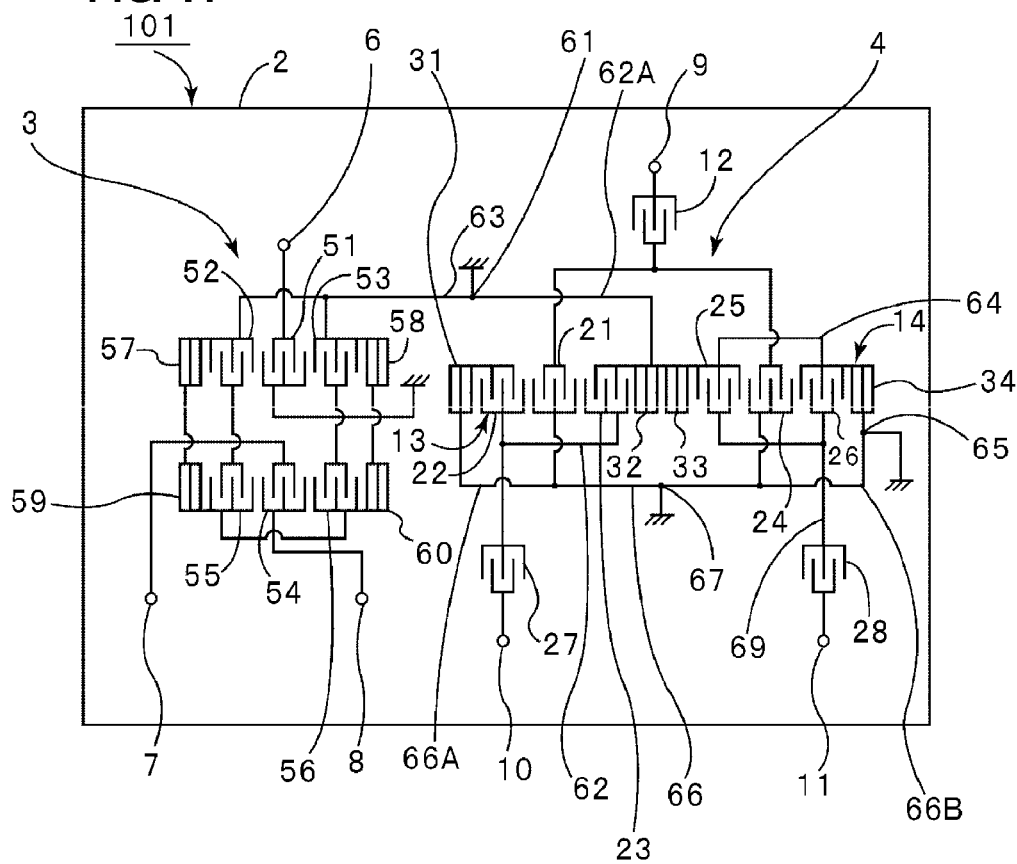
FIG. 11 is a schematic plan view of a composite filter according to a second preferred embodiment of the present invention.

FIG. 11 is a schematic plan view of a composite filter according to a second preferred embodiment of the present invention. A composite filter 101 according to the second preferred embodiment is configured similarly to the above-described composite filter 1 according to the first preferred embodiment, except that the two composite filters differ in an electrical connection structure between the first ground terminal 61 and the second IDT 22. Thus, the same components are denoted by the same reference numerals and description of those components is omitted.

In the composite filter 101 according to the second preferred embodiment, as in the first preferred embodiment, the first ground terminal 61 is arranged at a position closer to the side of the unbalance terminal 9 than the first and second acoustic wave filter elements 13, 14 and shifted to the side of the first acoustic wave filter element 13. Further, the third IDT 23 of the first acoustic wave filter element 13 is electrically connected to the first ground terminal 61 by a line 62A, but the line 62A is not connected to the ground end of the second IDT 22. In other words, an end of the reflector 31 is electrically connected by a ground line 66A to the line 66 which connects the ground ends of the first and fourth IDTs 21, 25 in common. In addition, the ground end of the second IDT 22 is connected to the line 66A through the reflector 31. Thus, the ground end of the second IDT 22 is not directly connected to the first ground terminal 61. The reflector 31 is connected to not only the second ground terminal 67 through the ground line 66A and the line 66, but also to the reflector 34 and the third ground terminal 65 by a line 66B connected to the line 66.

As described above, the second IDT 22 is not directly connected to the first ground terminal 61, but it is connected to the first ground terminal 61 through the reflector 31, the line 66A, the line 66, the line 66B, the reflector 34, the line 64, and the line 62A.

Accordingly, the influence from the first ground terminal 61 upon the ground-side ends of the IDTs 22 and 23, which are the balance-side IDTs in the first acoustic wave filter element 13, is reduced as compared to the first preferred embodiment. Thus, the extent of grounding at the IDTs 22 and 23, which are the balance-side IDTs in the first acoustic wave filter element 13, is closer to the extent of grounding at the IDTs 25 and 26, which are the balance-side IDTs in the second acoustic wave filter element 14. Compared to the first preferred embodiment, therefore, the balance level and the attenuation characteristic can be improved in the frequency range outside the pass band on the side higher than the pass band. This point will be described below with reference to FIGS. 12 to 15.

Figure 12:
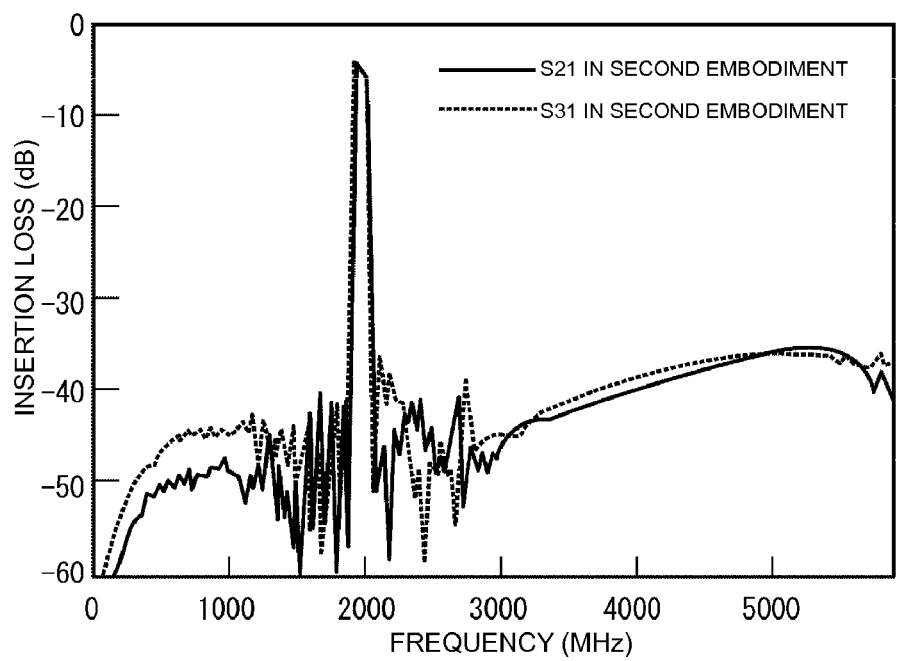
FIG. 12 is a graph illustrating an attenuation characteristic S21 at a first balance terminal and an attenuation characteristic S31 at a second balance terminal in the second preferred embodiment of the present invention.
Figure 13:
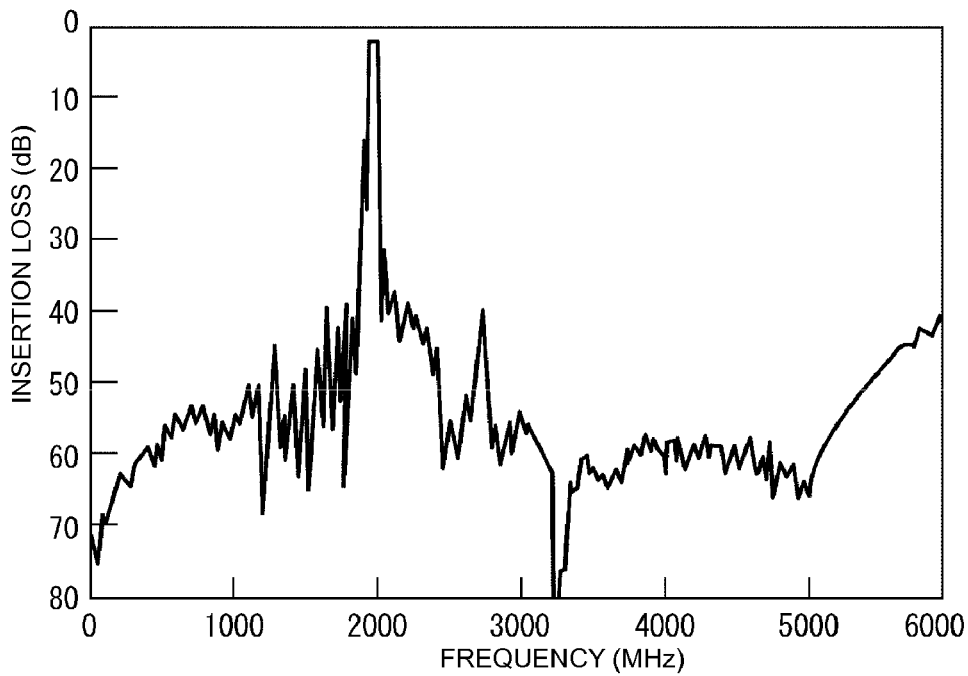
FIG. 13 is a graph illustrating a differential attenuation characteristic between the first and second balance terminals in the acoustic wave filter device according to the second preferred embodiment of the present invention.

FIG. 12 is a graph illustrating an attenuation characteristic S21 at the first balance terminal and an attenuation characteristic S31 at the second balance terminal in the second preferred embodiment. A solid line represents the attenuation characteristic S21 at the first balance terminal, and a dotted line represents the attenuation characteristic S31 at the second balance terminal. FIG. 13 is a graph illustrating a differential attenuation characteristic between the first and second balance terminals.

Figure 14:
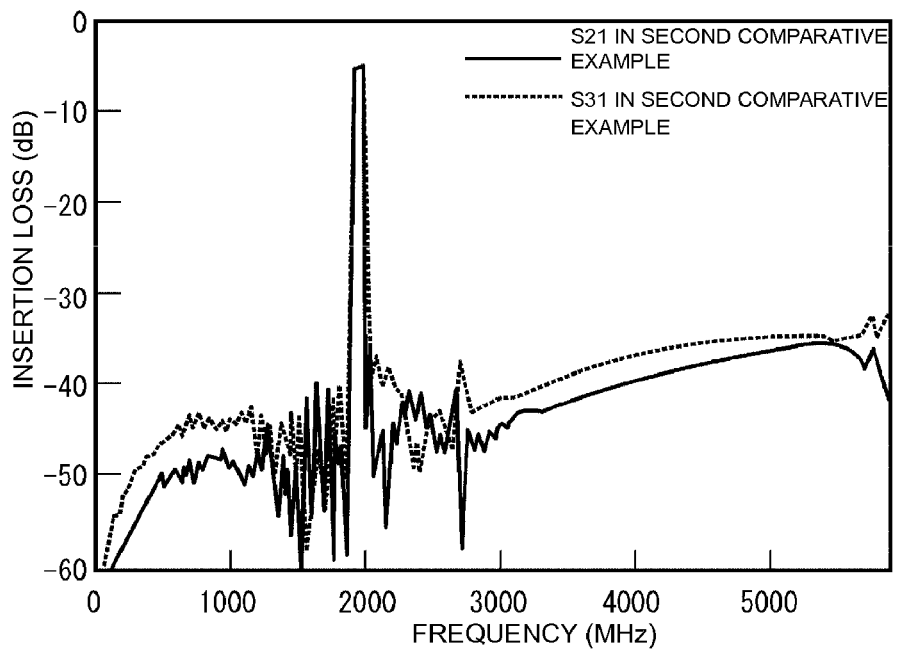
FIG. 14 is a graph illustrating respective attenuation characteristics S21 and S31 at first and second balance terminals in an acoustic wave filter device according to a second comparative example.
Figure 15:
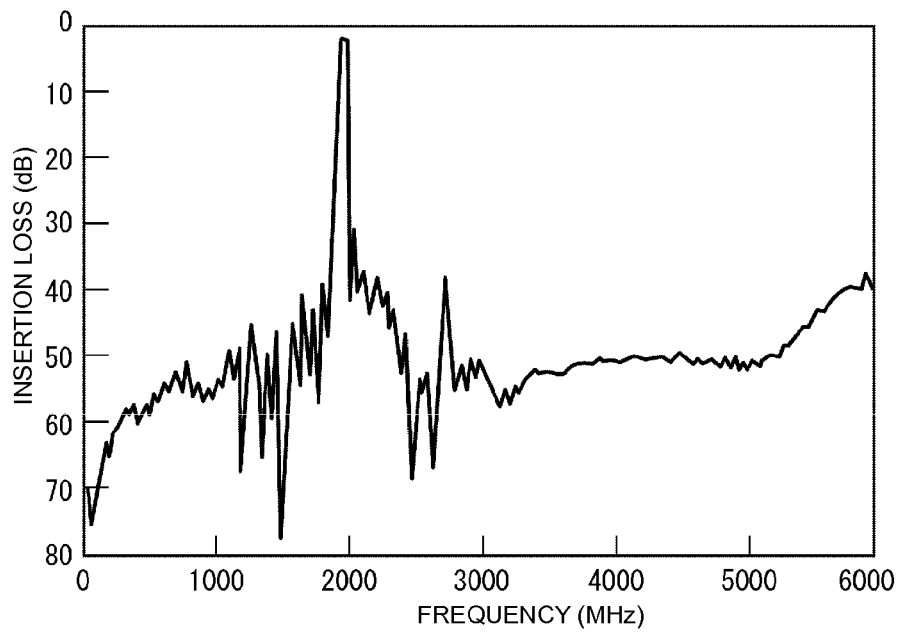
FIG. 15 is a graph illustrating a differential attenuation characteristic between the first and second balance terminals in the acoustic wave filter device according to the second comparative example.

For comparison, a composite filter (not shown) according to a second comparative example is prepared which is similarly to the above-described composite filter 1 according to the second preferred embodiment except that the third ground terminal 65 is not provided. FIG. 14 is a graph illustrating respective attenuation characteristics at first and second balance terminals in the second comparative example. FIG. 15 is a graph illustrating a differential attenuation characteristic between the first and second balance terminals. In the graph of FIG. 14, a solid line represents the attenuation characteristic S21 at the first balance terminal, and a dotted line represents the attenuation characteristic S31 at the second balance terminal.

As shown by comparing FIGS. 12 and 13 with FIGS. 14 and 15, in the second preferred embodiment, the differential attenuation characteristic between the first and second balance terminals can be improved on the higher frequency side than the pass band, i.e., in a frequency range of not lower than about 3000 MHz, as compared to the second comparative example. Thus, the balance level can also be improved.

By comparing FIGS. 12 and 13 with FIGS. 4 and 3, in particular, it is further shown that the second preferred embodiment can provide a higher balance level and a better differential attenuation characteristic than the first preferred embodiment on the higher frequency side than the pass band.

Figure 16:
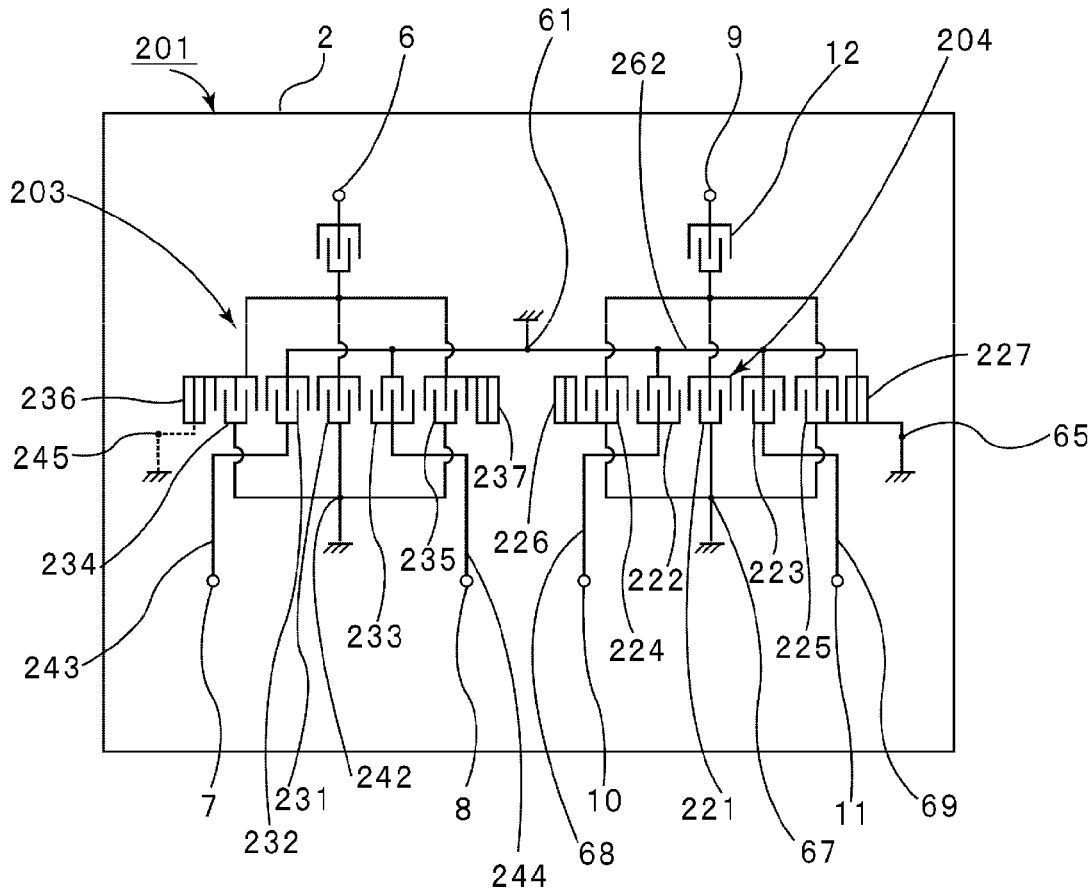
FIG. 16 is a schematic plan view of a composite filter according to a third preferred embodiment of the present invention.

FIG. 16 is a schematic plan view of a composite filter according to a third preferred embodiment of the present invention.

In a composite filter 201 according to the third preferred embodiment, a DCS reception filter 203 having a pass band of 1805 to 1880 MHz and a PCS reception filter 204 having a pass band of 1930 MHz to 1990 MHz are provided on the piezoelectric substrate 2.

Each of the reception filters 203 and 204 is a 5-IDT longitudinally-coupled resonator-type acoustic surface wave filter element.

As in this third preferred embodiment, a 5-IDT longitudinally-coupled resonator-type acoustic wave filter can also be used instead of the 3-IDT filter.

A balanced acoustic wave filter device according to the third preferred embodiment is used as the reception filter 204 in the composite filter 201.

The reception filter 204 is connected between the unbalance terminal 9 and the first and second balance terminals 10, 11. In addition, the reception filter 203 is connected between the unbalance terminal 6 and the first and second balance terminals 7, 8.

In the PCS reception filter 204, second and third IDTs 222, 223 are arranged on both sides of a first IDT 221 in the direction of propagation of acoustic surface waves, and fourth and fifth IDTs 224 and 225 are arranged on both sides, in the direction of propagation of acoustic surface waves, of an area in which the IDTs 221 to 223 are disposed. A respective end of each of the first IDT 221, the fourth IDT 224, and the fifth IDT 225 is connected in common and further connected to the unbalance terminal 9 through the acoustic surface wave resonator 12. A respective other end of each of the first IDT 221, the fourth IDT 224, and the fifth IDT 225 is connected in common and further connected to the second ground terminal 67. One end of the second IDT 22 and one end of the third IDT 223 are connected in common by a line 262 and further connected to the first ground terminal 61.

Meanwhile, the other end of the second IDT 222 is connected to the first balance terminal 10 through the first signal wiring 68. In addition, the other end of the third IDT 223 is connected to the second balance terminal 11 through the second signal wiring 69. In this second preferred embodiment, the second ground terminal 67 is similarly disposed in an area between the first and second signal wirings 68, 69.

In addition, a ground end of the fifth IDT 225 is connected to a reflector 227, and the reflector 227 is connected to the third ground terminal 65.

In this second preferred embodiment, the first ground terminal 61 is disposed at a position closer to the side of the unbalance terminal 9 than the reception filter 4 which is the acoustic wave filter element, and the third ground terminal 65 is disposed at a position that is point-symmetric to the first ground terminal 61 with respect to a center of the reception filter 204. Here, the center of the reception filter 204 denotes a center of a region in which the first to fifth IDTs 221 to 225 of the 5-IDT acoustic surface wave filter element are disposed.

Also in this second preferred embodiment, therefore, the influence of impedance in the ground wiring is substantially equivalent between the side including the second IDT 222, which is the IDT on the side of the first balance terminal 10, and the side including the third IDT 223, which is the IDT on the side of the second balance terminal 11. Accordingly, as in the first preferred embodiment, both of the balance level and the differential attenuation characteristic between the first and second balance terminals are improved on the higher frequency side than the pass band.

In FIG. 16, the DCS reception filter 203 also includes, as first to fifth IDTs, a fourth IDT 234, a second IDT 232, a first IDT 231, a third IDT 233, and a fifth IDT 235 which are arranged in that order in the direction of propagation of acoustic surface waves. Further, reflectors 236 and 237 are arranged on both sides, in the direction of propagation of acoustic surface waves, of an area in which the first to fifth IDTs 231 to 235 are disposed.

In the reception filter 203, a respective end of each of the first IDT 231, the fourth IDT 234, and the fifth IDT 235 is connected in common and further connected to the unbalance terminal 6 through an acoustic surface wave resonator 241. A respective other end of each of the IDTs 231, 234 and 235 is connected in common and further connected to a ground terminal 242. Moreover, the second IDT 232 is connected to the first balance terminal through a first signal wiring 243. The third IDT 233 is connected to the second balance terminal through a second signal wiring 244. The ground terminal 242 is disposed between the first and second signal wirings 243, 244.

In the reception filter 203, it is also preferable that, as indicated by a dotted line, a third ground terminal 245 connected to the reflector 236 is disposed in a point-symmetric relationship relative to the first ground terminal 61 with respect to a center of the reception filter 203. Here, the center of the reception filter 203 denotes a center of a region in which the first to fifth IDTs 231 to 235 are disposed.

Therefore, with such an arrangement, both of the balance level and the differential attenuation characteristic between the first and second balance terminals 7, 8 can be improved on the higher frequency side than the pass band in the reception filter 203 as well.

Figure 17:
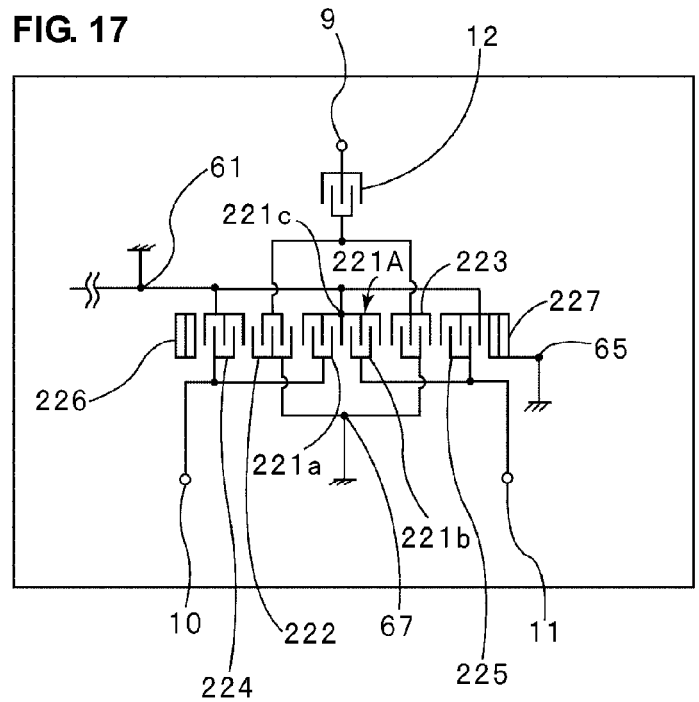
FIG. 17 is a schematic plan view of an acoustic wave filter device according to a modification of the third preferred embodiment of the present invention.
Figure 18:
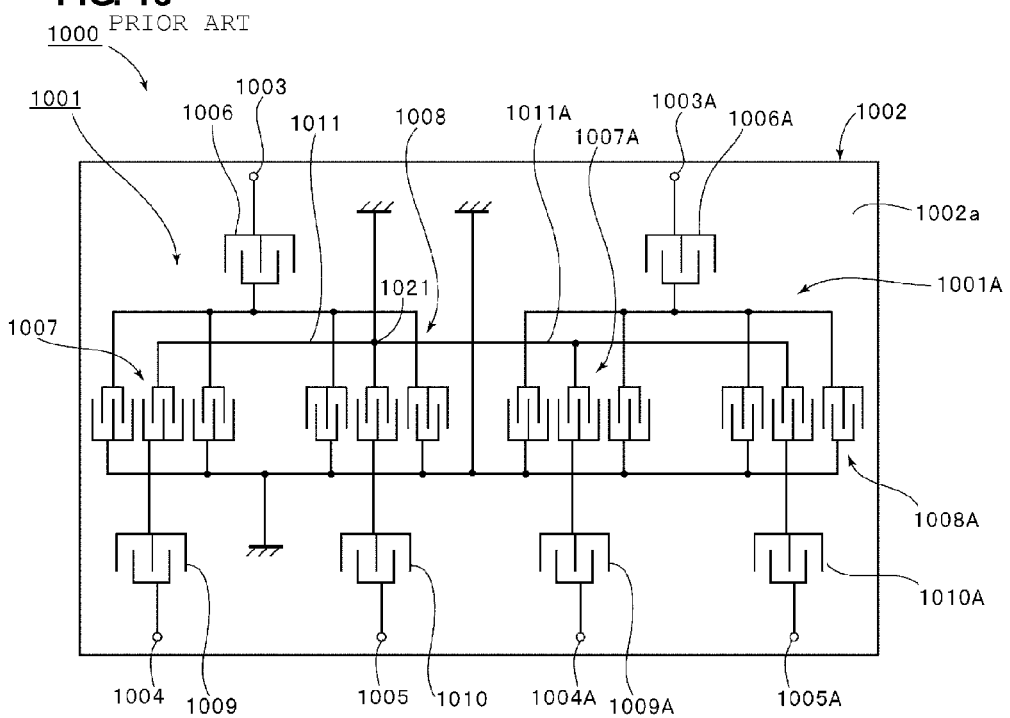
FIG. 18 is a schematic plan view illustrating one example of known acoustic wave filter devices.

FIG. 16 illustrates, as the acoustic wave filter device according to the third preferred embodiment, the reception filter 204 in which the first, fourth, and fifth IDTs 221, 224, 225 are IDTs connected to the unbalance terminal. However, in the 5-IDT longitudinally-coupled resonator-type acoustic surface wave filter, the first, fourth, and fifth IDTs 221, 224, 225 may preferably be IDTs connected to the balance terminals. FIG. 17 illustrates a modification of the 5-IDT longitudinally-coupled resonator-type filter. In the modification of FIG. 17, a first central IDT 221A includes first and second split IDT portions 221a, 221b which are provided by splitting an IDT in the direction of propagation of acoustic surface waves. A respective end of each of the first split IDT portion 221a and the fourth IDT 224 is connected to the first balance terminal 10. A respective end of each of the second split IDT portion 221b and the fifth IDT 225 is connected in common and further connected to the second balance terminal 11. Moreover, a respective end of each of the second and third IDTs 222 and 223 is connected in common and further connected to the unbalance terminal 9. In this case, an end of the fourth IDT 224, which is connected to the ground potential, is connected to the first ground terminal 61. Thus, an end of the fifth IDT 225 on the side connected to the ground potential is connected to the third ground terminal 65 which is arranged in a point-symmetric relationship relative to the first ground terminal 61 with respect to the center of the reception filter 204.

A respective other end of each of the first and second split IDT portions 221a and 221b are connected to define a middle point portion 221c. In FIG. 17, the middle point portion 221c is connected to the first ground terminal 61. The middle point portion 221c may preferably be electrically floated from the wiring connected to the ground potential, for example.

While the first to third preferred embodiments have been each described in connection with the acoustic surface wave filter element, the present invention may also be applied to an acoustic wave filter device using an acoustic boundary wave element instead of the acoustic surface wave filter element.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A balanced acoustic wave filter device comprising:
an unbalance terminal;
first and second balance terminals;
a piezoelectric substrate;
a first longitudinally-coupled acoustic wave filter element disposed on the piezoelectric substrate, including second, first, and third IDTs connected between the unbalance terminal and the first balance terminal and successively arranged in a direction of propagation of acoustic surface waves, and including first and second reflectors arranged on both sides, in a direction of propagation of acoustic surface waves, of an area in which the first to third IDTs are disposed; and
a second longitudinally-coupled acoustic wave filter element disposed on the piezoelectric substrate in a spaced relationship, in the direction of propagation of acoustic surface waves, to a portion of the piezoelectric substrate in which the first acoustic wave filter element is disposed, including fifth, fourth and sixth IDTs connected between the unbalance terminal and the second balance terminal and successively arranged in the direction of propagation of acoustic surface waves, and including third and fourth reflectors arranged on both sides, in the direction of propagation of acoustic surface waves, of an area in which the fourth to sixth IDTs are disposed, the second acoustic wave filter element providing an output signal having a phase with respect to an input signal, which differs by 180° from a phase of an output signal of the first acoustic wave filter element with respect to an input signal; wherein the balanced acoustic wave filter device further comprises a first ground terminal which is disposed at a position closer to a side of the unbalance terminal than the first and second acoustic wave filter elements and shifted to the side of the first acoustic wave filter element from a middle point between the first and second acoustic wave filter elements, and which is electrically connected to a respective end of each of the second, third, fifth, and sixth IDTs, or to a respective end of each of the first and fourth IDTs;

a third ground terminal which is electrically connected to the respective end of each of the second, third, fifth, and sixth IDTs, or to the respective end of each of the first and fourth IDTs, and which is arranged in a point-symmetric relationship relative to the first ground terminal with respect to the middle point between the first and second acoustic wave filter elements;

a first signal wiring which is connected to a respective other end of each of the second and third IDTs, or to the other end of the first IDT, and which connects the first acoustic wave filter element and the first balance terminal to each other;

a second signal wiring which is connected to a respective other end of each of the fifth and sixth IDTs, or to the other end of the fourth IDT, and which connects the second acoustic wave filter element and the second balance terminal to each other; and a second ground terminal disposed in an area between the first and second signal wirings.

2. A composite filter including the balanced acoustic wave filter device according to claim 1.

3. The composite filter according to claim 2, wherein the composite filter includes the balanced acoustic wave filter device and another acoustic wave filter device that is different from the balanced acoustic wave filter device, the balanced acoustic wave filter device and the other acoustic wave filter device being disposed on one piezoelectric substrate, the balanced acoustic wave filter device and the other acoustic wave filter device sharing the first ground terminal.

4. A balanced acoustic wave filter device comprising:
an unbalance terminal;
first and second balance terminals;
a piezoelectric substrate;
a first longitudinally-coupled acoustic wave filter element disposed on the piezoelectric substrate, including second, first and third IDTs connected between the unbalance terminal and the first balance terminal and successively arranged in a direction of propagation of acoustic surface waves, and including first and second reflectors arranged on both sides, in the direction of propagation of acoustic surface waves, of an area in which the first to third IDTs are disposed;
a second longitudinally-coupled acoustic wave filter element disposed on the piezoelectric substrate in a spaced relationship, in the direction of propagation of acoustic surface waves, to a portion of the piezoelectric substrate in which the first acoustic wave filter element is disposed, including fifth, fourth, and sixth IDTs connected between the unbalance terminal and the second balance terminal and successively arranged in the direction of propagation of acoustic surface waves, and including third and fourth reflectors arranged on both sides, in the direction of propagation of acoustic surface waves, of an area in which the fourth to sixth IDTs are disposed, the second acoustic wave filter element providing an output signal having a phase with respect to an input signal, which differs by 180° from a phase of an output signal of the first acoustic wave filter element with respect to an input signal; wherein
the balanced acoustic wave filter device further comprises
a first ground terminal which is disposed at a position closer to the side of the unbalance terminal than the first and second acoustic wave filter elements and shifted to the side of the first acoustic wave filter element from a middle point between the first and second acoustic wave filter elements, and to which are connected the second, third, fifth, and sixth IDTs;
a third ground terminal to which are connected the second, third, fifth, and sixth IDTs, and which is arranged in a point-symmetric relationship relative to the first ground terminal with respect to the middle point between the first and second acoustic wave filter elements;
a first signal wiring connecting the first IDT of the first acoustic wave filter element and the first balance terminal to each other;
a second signal wiring connecting the fourth IDT of the second acoustic wave filter element and the second balance terminal to each other; and a second ground terminal disposed in an area between the first and second signal wirings; wherein
the second IDT includes a ground end connected to the first ground terminal, the ground end of the second IDT not being directly connected to the first ground terminal and being connected to the first ground terminal through an end of the third IDT, which is connected to a ground potential.

5. A composite filter including the balanced acoustic wave filter device according to claim 4.

6. The composite filter according to claim 5, wherein the composite filter includes the balanced acoustic wave filter device and another acoustic wave filter device that is different from the balanced acoustic wave filter device, the balanced acoustic wave filter device and the other acoustic wave filter device being disposed on one piezoelectric substrate, the balanced acoustic wave filter device and the other acoustic wave filter device sharing the first ground terminal.

7. A balanced acoustic wave filter device comprising:
an unbalance terminal;
first and second balance terminals;
a piezoelectric substrate; and
a first IDT disposed on the piezoelectric substrate, second and third IDTs arranged on both sides of the first IDT in a direction of propagation of acoustic surface waves, fourth and fifth IDTs arranged on both sides, in a direction of propagation of acoustic surface waves, of a portion in which the first to third IDTs are disposed, and first and second reflectors arranged on both sides, in the direction of propagation of acoustic surface waves, of a portion in which the first to fifth IDTs are disposed; wherein
the balanced acoustic wave filter device further comprises an unbalance terminal and first and second balance terminals;
a first ground terminal disposed on the piezoelectric substrate at a position that is closer to the side of the unbalance terminal than the first to fifth IDTs and is shifted toward the side of the fourth IDT from a center of the first IDT;
first and second signal wirings connecting a respective end of each of the second and third IDTs to the first and second balance terminals, respectively;
a second ground terminal disposed in an area between the first and second signal wirings; and
a third ground terminal arranged in a point-symmetric relationship relative to the first ground terminal with respect to a center of the portion in which the first to fifth IDTs are disposed; wherein
a respective end of each of the first, fourth, and fifth IDTs is connected to the unbalance terminal, and respective other ends thereof are connected to the second ground terminal, the third IDT having a polarity that is reversed to a polarity of the second IDT;
a respective end of each of the second and third IDTs is connected to the first and second signal wirings, respectively, and respective other ends thereof are connected to the first ground terminal; and
an end of the second IDT on a side connected to the ground terminal and an end of the third IDT on a side connected to the ground terminal are connected to the first ground terminal at a position shifted to the side of the fourth IDT from a center of the balanced acoustic wave filter device and are connected to the third ground terminal at a position shifted to the side of the fifth IDT from the center of the balanced acoustic wave filter device.

8. A composite filter including the balanced acoustic wave filter device according to claim 7.

9. The composite filter according to claim 8, wherein the composite filter includes the balanced acoustic wave filter device and another acoustic wave filter device that is different from the balanced acoustic wave filter device, the balanced acoustic wave filter device and the other acoustic wave filter device being disposed on one piezoelectric substrate, the balanced acoustic wave filter device and the other acoustic wave filter device sharing the first ground terminal.

10. A balanced acoustic wave filter device of longitudinally-coupled resonator type comprising:

a piezoelectric substrate;

a first IDT disposed on the piezoelectric substrate; and second and third IDTs arranged on both sides of the first IDT in a direction of propagation of acoustic surface waves, fourth and fifth IDTs arranged on both sides, in the direction of propagation of acoustic surface waves, of a portion in which the first to third IDTs are disposed, and first and second reflectors arranged on both sides, in a direction of propagation of acoustic surface waves, of a portion in which the first to fifth IDTs are disposed; wherein the balanced acoustic wave filter device includes an unbalance terminal and first and second balance terminals;

a respective end of each of the second and third IDTs is connected to the unbalance terminal;

the first IDT includes a first split IDT portion and a second split IDT portion which are defined by the first IDT being split in the direction of propagation of acoustic surface waves, and a middle point portion at which a respective other end of each of the first and second split IDT portions are connected to each other;

the first split IDT portion and the fourth IDT are connected to the first balance terminal, and the second split IDT portion and the fifth IDT are connected to the second balance terminal;

the third IDT has a polarity that is reversed with respect to a polarity of the second IDT; and the balanced acoustic wave filter device further comprises a first ground terminal disposed on the piezoelectric substrate at a position that is closer to the side of the unbalance terminal than the first to fifth IDTs and is shifted toward the side of the fourth IDT from a center of the first IDT;

a first signal wiring connecting one end of the fourth IDT and one end of the first split IDT portion to the first balance terminal;

a second signal wiring connecting one end of the fifth IDT and one end of the second split IDT portion to the second balance terminal;

a second ground terminal which is disposed in an area between the first signal wiring and the second signal wiring, and which is connected to respective other ends of the second and third IDTs; and a third ground terminal arranged in a point-symmetric relation to the first ground terminal with respect to a center of the portion in which the first to fifth IDTs are disposed; wherein the other end of the fourth IDT, the middle point portion of the first IDT, and the other end of the fifth IDT are all connected to the first balance terminal at a position close to the side of the fourth IDT and are all connected to the third balance terminal at a position close to the side of the fifth IDT.

11. A composite filter including the balanced acoustic wave filter device according to claim 10.

12. The composite filter according to claim 11, wherein the composite filter includes the balanced acoustic wave filter device and another acoustic wave filter device that is different from the balanced acoustic wave filter device, the balanced acoustic wave filter device and the other acoustic wave filter device being disposed on one piezoelectric substrate, the balanced acoustic wave filter device and the other acoustic wave filter device sharing the first ground terminal.

\* \* \* \* \*